(12) United States Patent
Shih

(10) Patent No.: US 10,684,706 B1
(45) Date of Patent: Jun. 16, 2020

(54) MOUSE ROLLER MODULE

(71) Applicant: PRIMAX ELECTRONICS LTD., Taipei (TW)

(72) Inventor: Yu-Yen Shih, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 16/254,888

(22) Filed: Jan. 23, 2019

(30) Foreign Application Priority Data

Dec. 7, 2018 (TW) .............................. 107144184 A

(51) Int. Cl.
*G06F 3/0362* (2013.01)
*G06F 3/0354* (2013.01)
*G01R 33/07* (2006.01)
*G06F 3/01* (2006.01)
*G06F 3/038* (2013.01)

(52) U.S. Cl.
CPC ........... *G06F 3/0362* (2013.01); *G01R 33/07* (2013.01); *G06F 3/016* (2013.01); *G06F 3/038* (2013.01); *G06F 3/03543* (2013.01)

(58) Field of Classification Search
CPC ........... B23P 19/04; G01B 7/30; G01D 5/145; G06F 1/3215; G06F 3/0362; Y10T 29/49826; Y10T 29/5313
See application file for complete search history.

(56) References Cited

U.S. PATENT DOCUMENTS

| | | | | |
|---|---|---|---|---|
| 8,587,294 B2* | 11/2013 | Masson | ................. | G01D 5/145 324/207.24 |
| 2009/0096641 A1* | 4/2009 | Inoue | ..................... | G01D 5/145 341/35 |
| 2011/0025311 A1* | 2/2011 | Chauvin | ................ | G01D 5/145 324/207.25 |

* cited by examiner

*Primary Examiner* — Nelson M Rosario
(74) *Attorney, Agent, or Firm* — WPAT, PC

(57) ABSTRACT

A mouse roller module includes a roller, a sensing unit, an electromagnet and a control unit. The roller includes a ring-shaped magnet and a rotating shaft. The rotating shaft is extended along a first direction. When an external force is exerted on the roller, the ring-shaped magnet is rotated about the rotating shaft. The sensing unit is located near the roller to sense a pole of the ring-shaped magnet. The roller is arranged between the electromagnet and the sensing unit. The electromagnet and the ring-shaped magnet interact with each other to generate a magnetic force. The control unit is electrically connected with the sensing unit and the electromagnet. The control unit controls the electromagnet and the ring-shaped magnet of the roller to generate the magnetic force according to a result of sensing the pole of the ring-shaped magnet by the sensing unit.

8 Claims, 6 Drawing Sheets

MOUSE ROLLER MODULE

FIELD OF THE INVENTION

The present invention relates to a roller module, and more particularly to a roller module for an input device.

BACKGROUND OF THE INVENTION

In the digitalized era, computers and associated electronic devices are very popular. For example, computers become essential devices in every family. As known, a mouse device is an important input device for the computer system. Via the mouse device, the user may communicate with the computer system. In addition, the mouse devices with improved or new functions are gradually developed.

A mouse device is used to control a cursor on a computer screen in order to operate the computer. Since 1968, the United States has produced the world's first mouse device. After then, the mouse device is applied to paper processing operations, video games, industrial drawings, drawing design or media production. Consequently, the mouse device has become an indispensable part of the computer system. In the early stage, the mouse device uses a trackball to detect the displacement of the mouse device. With increasing development of science and technology, an optical module or a laser module is used to detect the displacement of the mouse device in order to enhance the working efficiency. Moreover, for increasing the functionality and convenience of the mouse device, the earliest wired single-button mouse device is gradually evolved into the modern wireless multi-button roller mouse device. For complying with different industrial needs or personal preferences, various electronic manufacturers have begun to create a variety of mouse device devices with different shapes in order to meet the operation requirements of different users. Consequently, people pay much attention to the comfort and sensitivity of pressing or operating the left button, the right button and the middle button.

In addition to the left button and the right button, a roller of the mouse device is another kind of button that is frequently used by the user of the computer. For example, by rotating the roller, the function of browsing web pages or moving the cursor is achieved. Alternatively, by pressing the roller, a middle button signal is generated or the function of switching different operation mode is achieved. For increasing the convenience and comfort of operating the roller, a roller module of an input device is disclosed in Taiwanese Patent No. I448928. In the roller module, a recess or a hollow slot of the roller is equipped with one or two different toothed surfaces. When a swinging arm is contacted with one of the toothed surfaces, the rotation of the roller generates different tactile feels. Moreover, a hyper-fast roller structure of a mouse device is disclosed in Taiwanese Patent No. M498914. A tooth part and a stopping rod are installed in the roller module. In case that the stopping rod is pushed by a torsion spring, the stopping rod is in close contact with the tooth part. When a button linked with the stopping rod is operated by the user, the roller is switched between a hyper-fast scrolling mode and an ordinary scrolling mode.

However, since the mechanical of the mouse device for performing the hyper-fast scrolling motion is designed according to the principle of inertia, the conventional technologies still have some drawbacks. For example, only some default scrolling modes are provided for the user to switch the operation mode of the roller. Moreover, the consumers cannot adjust the default scrolling modes according to their requirements or the preferences. Consequently, the consumer has to spend more time in searching the suitable mouse device. If the mouse device is not suitable, the working efficiency is deteriorated.

Therefore, there is a need of providing an improved mouse roller module in order to overcome the above drawbacks.

SUMMARY OF THE INVENTION

The present invention provides a mouse roller module. The mouse roller module is equipped with a sensing unit for sensing the pole of a ring-shaped magnet within a roller. Under control of a control unit, the pole of the ring-shaped magnet and the pole of the electromagnet close to the ring-shaped magnet are like poles or opposite poles. Due to this design, the user can adjust the rotating effect of the roller according to the practical requirements. Consequently, the rotating speed of the roller can be selectively increased or decreased.

The other objects and advantages of the present invention will be understood from the disclosed technical features.

In accordance with an aspect of the present invention, there is provided a mouse roller module. The mouse roller module includes a roller, a sensing unit, an electromagnet and a control unit. The roller includes a ring-shaped magnet and a rotating shaft. The rotating shaft is extended along a first direction. When an external force is exerted on the roller, the ring-shaped magnet is rotated about the rotating shaft, and a position of the roller close to the sensing unit has a tangential speed direction. The sensing unit is located near the roller to sense a pole of the ring-shaped magnet. The roller is arranged between the electromagnet and the sensing unit. The electromagnet and the ring-shaped magnet interact with each other to generate a magnetic force. The control unit is electrically connected with the sensing unit and the electromagnet. The control unit controls the electromagnet and the ring-shaped magnet of the roller to generate the magnetic force according to a result of sensing the pole of the ring-shaped magnet by the sensing unit.

From the above descriptions, the present invention provides the mouse roller module. The mouse roller module is equipped with the sensing unit for sensing the pole of the ring-shaped magnet within the casing of the roller. The control unit controls the electromagnet and the ring-shaped magnet to generate a magnetic force according to the result of sensing the pole of the ring-shaped magnet. The pole of the ring-shaped magnet and the pole of the electromagnet close to the ring-shaped magnet are like poles or opposite poles. Due to this design, the user can adjust the rotating effect of the roller according to the practical requirements. Consequently, the rotating speed of the roller can be selectively increased or decreased. Consequently, the flexibility and tactile feel of operating the mouse roller module are enhanced.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
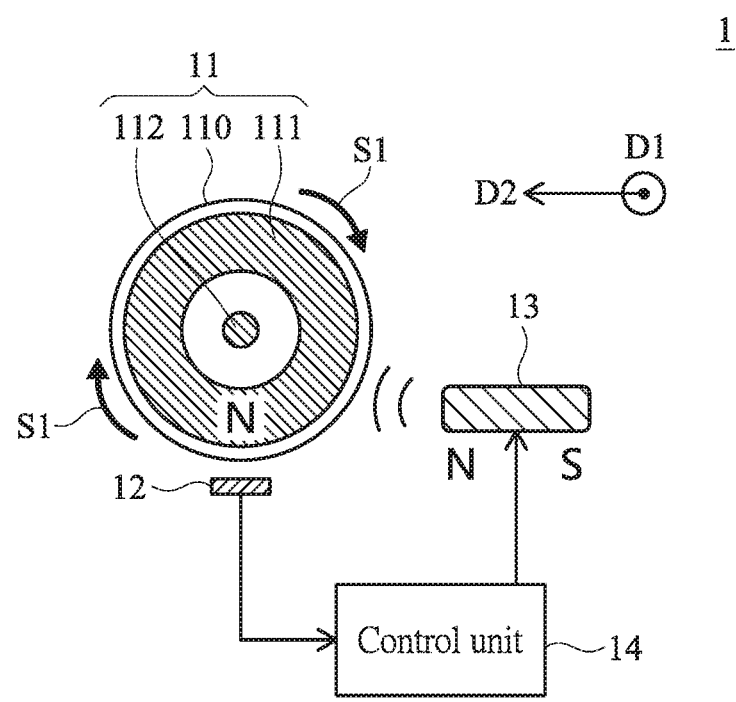
FIG. 1 schematically illustrates a mouse roller module according to a first embodiment of the present invention and in a first usage state.
Figure 2:
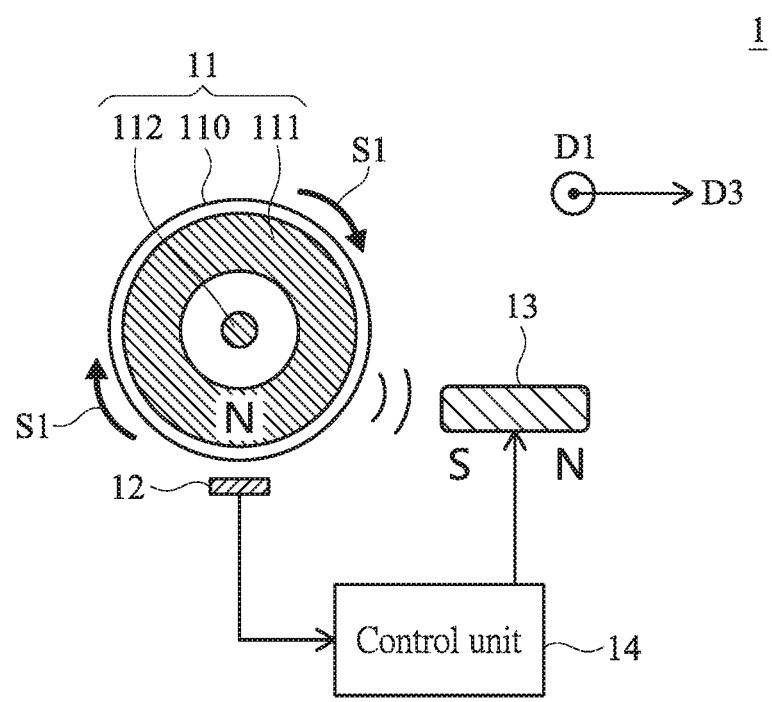
FIG. 2 schematically illustrates the mouse roller module as shown in FIG. 1 and in a second usage state.

Please refer to FIGS. 1 and 2. FIG. 1 schematically illustrates a mouse roller module according to a first embodiment of the present invention and in a first usage state. FIG. 2 schematically illustrates the mouse roller module as shown in FIG. 1 and in a second usage state. As shown in FIGS. 1 and 2, the mouse roller module 1 comprises a roller 11, a sensing unit 12, an electromagnet 13 and a control unit 14.

The roller 11 comprises a ring-shaped magnet 111 and a rotating shaft 112. The rotating shaft 112 is extended along a first direction D1. The roller 11 further comprises a casing 110. The ring-shaped magnet 111 and the rotating shaft 112 are disposed within the casing 120. In addition, a portion of the rotating shaft 112 is exposed outside the casing 120 and connected with other components (not shown) of the mouse device. When an external force is exerted on the casing 110 of the roller 11, the ring-shaped magnet 111 and the casing 110 are rotated about the rotating shaft 112. In this embodiment, the roller 11 is rotated in a clockwise direction S1. The rotating direction of the roller 11 is not restricted. For example, in another embodiment, the roller 11 is rotated in a counterclockwise direction. Preferably but not exclusively, the ring-shaped magnet 111 is permanent magnet. The sensing unit 12 is arranged near the roller 11. The sensing unit 12 is used for sensing the pole of the ring-shaped magnet 111 within the casing 110 of the roller 11. In this embodiment, the sensing unit 12 is a Hall sensor, and the sensing unit 12 is located under the roller 11. When the roller 11 is rotated in response to the external force, the pole of the ring-shaped magnet 111 over the sensing unit 12 is sensed by the sensing unit 12. It is noted that the installation position of the sensing unit 12 is not restricted. The roller 11 is arranged between the electromagnet 13 and the sensing unit 12. The electromagnet 13 and the ring-shaped magnet 111 interact with each other to generate a magnetic force. The control unit 14 is electrically connected with the sensing unit 12 and the electromagnet 13. After sensing the pole of the ring-shaped magnet 111, the sensing unit 12 generates a sensing result. According to the sensing result, the control unit 14 controls the electromagnet 13 and the ring-shaped magnet 111 to generate a magnetic force.

The structures and operations of the mouse roller module 1 will be described in more details as follows.

As shown in FIG. 1, the pole of the ring-shaped magnet 111 within the casing 110 of the roller 11 is the N pole. In a first usage state, the user issues a command to the mouse roller module 1 to increase the rotating effect of the roller 11. The sensing result of the sensing unit 12 indicates that the pole of the ring-shaped magnet 111 is the N pole. According to the sensing result, the control unit 14 issues a control signal to the electromagnet 13. According to the control signal, the electromagnet 13 and the ring-shaped magnet 111 have like poles. That is, the region of the electromagnet 13 close to the ring-shaped magnet 111 has the N pole. Since like poles repel each other, a magnetic force in a second direction D2 is generated by the electromagnet 13 and the ring-shaped magnet 111. In addition, the magnetic force is a repelling force. The second direction D2 of the magnetic force is not in parallel with the first direction D1 (i.e., the extending direction of the rotating shaft 112. Preferably but not exclusively, the second direction D2 is perpendicular to the first direction D1. In case that the second direction D2 is perpendicular to the first direction D1, the magnetic force between the electromagnet 13 and the ring-shaped magnet 111 can be smoothly exerted on the roller 11. Consequently, the rotating speed of the roller 11 is increased. Moreover, since the magnetic force is the repelling force, the tangential speed direction of the roller 11 close to the sensing unit 12 is identical to the second direction D2 (i.e., the direction of the magnetic force). Since the ring-shaped magnet 111 is repelled by the repelling force, the rotating speed of the roller 11 is increased.

Please refer to FIG. 2. In a second usage state, the user issues a command to the mouse roller module 1 to decrease the rotating effect of the roller 11. The sensing result of the sensing unit 12 indicates that the pole of the ring-shaped magnet 111 is the N pole. According to the sensing result, the control unit 14 issues a control signal to the electromagnet 13. According to the control signal, the electromagnet 13 and the ring-shaped magnet 111 have opposite poles. That is, the region of the electromagnet 13 close to the ring-shaped magnet 111 has the S pole. Since unlike poles attract each other, a magnetic force in a third direction D3 is generated by the electromagnet 13 and the ring-shaped magnet 111. In addition, the magnetic force is an attractive force. The third direction D3 of the magnetic force is not in parallel with the first direction D1 (i.e., the extending direction of the rotating shaft 112. Preferably but not exclusively, the third direction D3 is perpendicular to the first direction D1. In case that the third direction D3 is perpendicular to the first direction D1, the magnetic force between the electromagnet 13 and the ring-shaped magnet 111 can be smoothly exerted on the roller 11. Consequently, the rotating speed of the roller 11 is decreased. Moreover, since the magnetic force is the attractive force, the tangential speed direction of the roller 11 close to the sensing unit 12 is opposite to the third direction D3 (i.e., the direction of the magnetic force). Since the ring-shaped magnet 111 is attracted by the attractive force, the rotating speed of the roller 11 is decreased.

As mentioned above, the mouse roller module 1 is equipped with the sensing unit 12 for sensing the pole of the ring-shaped magnet 111 within the casing 110 of the roller 11. The control unit 14 controls the electromagnet 13 and the ring-shaped magnet 111 to generate a magnetic force according to the result of sensing the pole of the ring-shaped magnet 111. The pole of the ring-shaped magnet 111 and the pole of the electromagnet 13 close to the ring-shaped magnet 111 are like poles or opposite poles. Due to this design, the user can adjust the rotating effect of the roller 11 according to the practical requirements. That is, the rotating speed of the roller 11 can be selectively increased or decreased. Consequently, the flexibility and tactile feel of operating the mouse roller module are enhanced.

Another embodiment of the mouse roller module will be described with reference to FIGS. 3 to 8.

Figure 3:
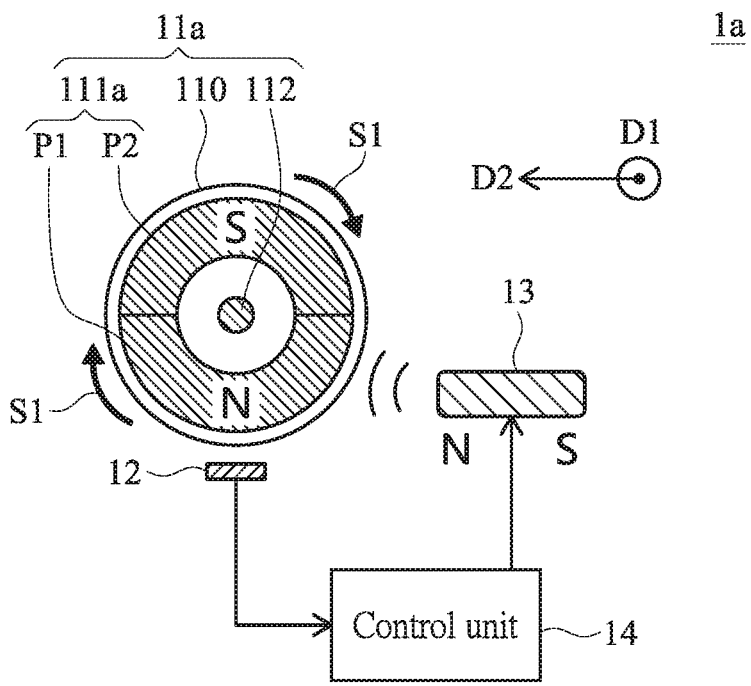
FIG. 3 schematically illustrates a mouse roller module according to a second embodiment of the present invention and in a first usage state.
Figure 4:
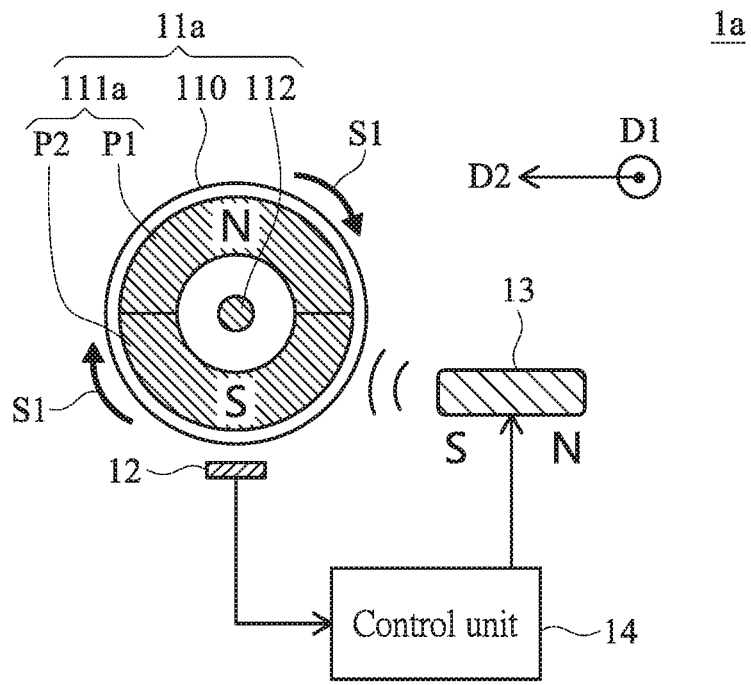
FIG. 4 schematically illustrates the mouse roller module as shown in FIG. 3 and at a different operating time point.
Figure 5:
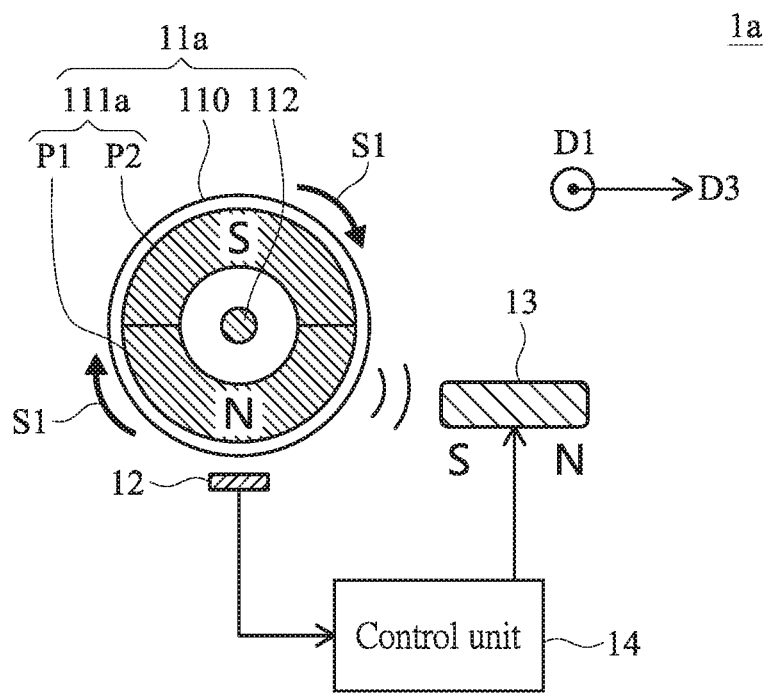
FIG. 5 schematically illustrates the mouse roller module as shown in FIG. 3 and in a second usage state.
Figure 6:
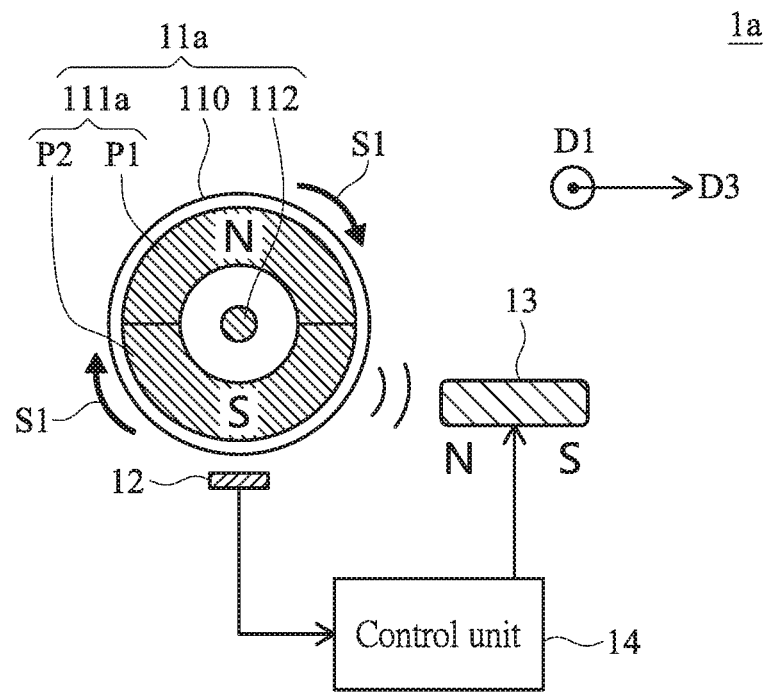
FIG. 6 schematically illustrates the mouse roller module as shown in FIG. 5 and at a different operating time point.
Figure 7:
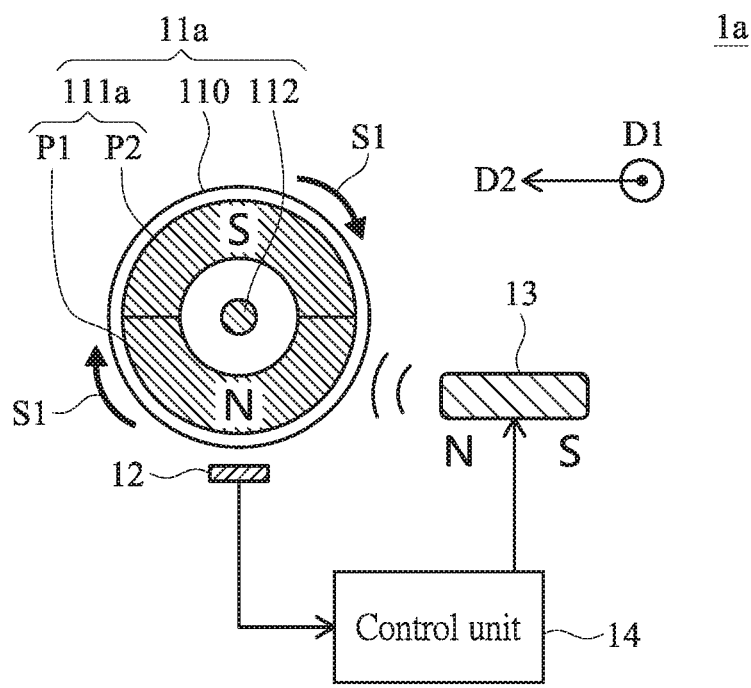
FIG. 7 schematically illustrates the mouse roller module as shown in FIG. 3 and in a third usage state.
Figure 8:
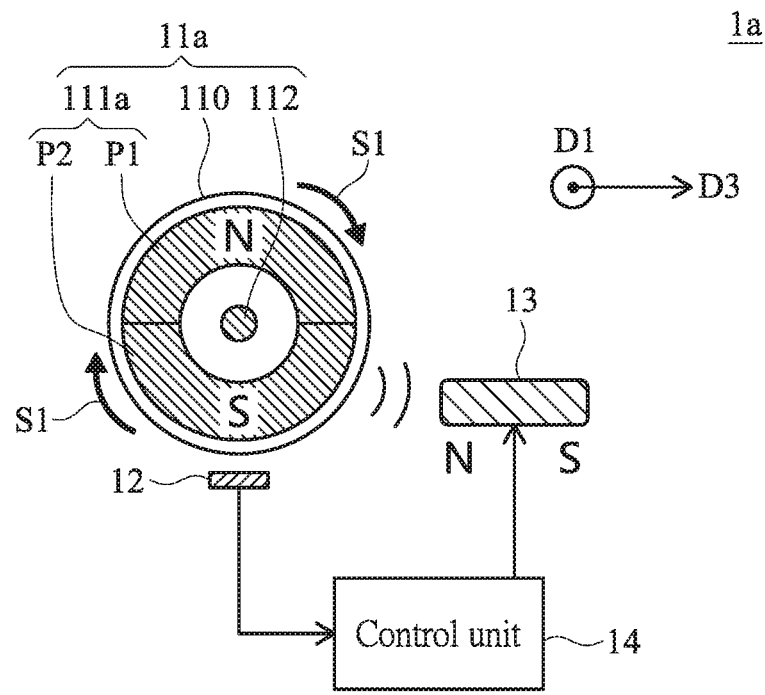
FIG. 8 schematically illustrates the mouse roller module as shown in FIG. 7 and at a different operating time point.

FIG. 3 schematically illustrates a mouse roller module according to a second embodiment of the present invention and in a first usage state. FIG. 4 schematically illustrates the mouse roller module as shown in FIG. 3 and at a different operating time point. FIG. 5 schematically illustrates the mouse roller module as shown in FIG. 3 and in a second usage state. FIG. 6 schematically illustrates the mouse roller module as shown in FIG. 5 and at a different operating time point. FIG. 7 schematically illustrates the mouse roller module as shown in FIG. 3 and in a third usage state. FIG. 8 schematically illustrates the mouse roller module as shown in FIG. 7 and at a different operating time point. Except for the structure of the ring-shaped magnet, the components of the mouse roller module 1a of this embodiment are similar to those of the mouse roller module of FIGS. 1 and 2. In this embodiment, the ring-shaped magnet 111a of the roller 11a comprises a first part P1 and a second part P2. The first part P1 and the second part P2 have opposite poles. In this embodiment, the first part P1 has the N pole, and the second part P2 has the S pole.

Please refer to FIGS. 3 and 4. In a first usage state, the user issues a command to the mouse roller module 1a to increase the rotating effect of the roller 11a. At the first time point as shown in FIG. 3, the sensing result of the sensing unit 12 indicates that the pole of the first part P1 of the ring-shaped magnet 111a is the N pole. According to the sensing result, the control unit 14 issues a control signal to the electromagnet 13. According to the control signal, the electromagnet 13 and the first part P1 of the ring-shaped magnet 111a have like poles. That is, the region of the electromagnet 13 close to the first part P1 of the ring-shaped magnet 111a has the N pole. Since like poles repel each other, a magnetic force in a second direction D2 is generated by the electromagnet 13 and the first part P1 of the ring-shaped magnet 111a. In addition, the magnetic force is a repelling force. The roller 11a is continuously rotated.

At the second time point as shown in FIG. 4, the second part P2 of the ring-shaped magnet 111a is within the sensitive range of the sensing unit 12 and thus sensed by the sensing unit 12. At the second time point, the sensing result of the sensing unit 12 indicates that the pole of the second part P2 of the ring-shaped magnet 111a is the S pole. According to the sensing result, the control unit 14 issues a control signal to the electromagnet 13. According to the control signal, the electromagnet 13 and the second part P2 of the ring-shaped magnet 111a have like poles. That is, the region of the electromagnet 13 close to the ring-shaped magnet 111a has the S pole. Since like poles repel each other, a magnetic force in the second direction D2 is generated by the electromagnet 13 and the second part P2 of the ring-shaped magnet 111a. In addition, the magnetic force is a repelling force.

The second direction D2 of the magnetic force is not in parallel with the first direction D1 (i.e., the extending direction of the rotating shaft 112. Preferably but not exclusively, the second direction D2 is perpendicular to the first direction D1. In case that the second direction D2 is perpendicular to the first direction D1, the magnetic force between the first part P1 and the second part P2 of the electromagnet 13 and the ring-shaped magnet 111a can be smoothly exerted on the roller 11a. Consequently, the rotating speed of the roller 11a is increased. Moreover, since the magnetic force between the first part P1 (and the second part P2) of the electromagnet 13 and the ring-shaped magnet 111a is the repelling force, the tangential speed direction of the roller 11a close to the sensing unit 12 is identical to the second direction D2 (i.e., the direction of the magnetic force). Since the first part P1 (and the second part P2) of the ring-shaped magnet 111a is repelled by the repelling force, the rotating speed of the roller 11a is increased.

Please refer to FIGS. 5 and 6. In a second usage state, the user issues a command to the mouse roller module 1a to decrease the rotating effect of the roller 11a. At the first time point as shown in FIG. 5, the sensing result of the sensing unit 12 indicates that the pole of the first part P1 of the ring-shaped magnet 111a is the N pole. According to the sensing result, the control unit 14 issues a control signal to the electromagnet 13. According to the control signal, the electromagnet 13 and the first part P1 of the ring-shaped magnet 111a have opposite poles. That is, the region of the electromagnet 13 close to the ring-shaped magnet 111a has the S pole. Since opposite poles attract each other, a magnetic force in a third direction D3 is generated by the electromagnet 13 and the first part P1 of the ring-shaped magnet 111a. In addition, the magnetic force is an attractive force. The roller 11a is continuously rotated.

At the second time point as shown in FIG. 6, the second part P2 of the ring-shaped magnet 111a is within the sensitive range of the sensing unit 12 and thus sensed by the sensing unit 12. At the second time point, the sensing result of the sensing unit 12 indicates that the pole of the second part P2 of the ring-shaped magnet 111a is the S pole. According to the sensing result, the control unit 14 issues a control signal to the electromagnet 13. According to the control signal, the electromagnet 13 and the second part P2 of the ring-shaped magnet 111a have opposite poles. That is, the region of the electromagnet 13 close to the ring-shaped magnet 111a has the N pole. Since opposite poles attract each other, a magnetic force in a third direction D3 is generated by the electromagnet 13 and the second part P2 of the ring-shaped magnet 111a. In addition, the magnetic force is an attractive force.

The third direction D3 of the magnetic force is not in parallel with the first direction D1 (i.e., the extending direction of the rotating shaft 112. Preferably but not exclusively, the third direction D3 is perpendicular to the first direction D1. In case that the third direction D3 is perpendicular to the first direction D1, the magnetic force between the electromagnet 13 and the first part P1 and the second part P2 of ring-shaped magnet 111a can be smoothly exerted on the roller 11a. Consequently, the rotating speed of the roller 11a is decreased. Moreover, since the magnetic force between the first part P1 (and the second part P2) of the electromagnet 13 and the ring-shaped magnet 111a is the attractive force, the tangential speed direction of the roller 11a close to the sensing unit 12 is opposite to the third direction D3 (i.e., the direction of the magnetic force). Since the ring-shaped magnet 111a is attracted by the attractive force, the rotating speed of the roller 11a is decreased.

As shown in FIGS. 7 and 8, the mouse roller module 1a is in a third usage state. At the first time point as shown in FIG. 7, the sensing result of the sensing unit 12 indicates that the pole of the first part P1 of the ring-shaped magnet 111a is the N pole. According to the sensing result, the control unit 14 issues a control signal to the electromagnet 13. According to the control signal, the electromagnet 13 and the first part P1 of the ring-shaped magnet 111a have like poles. That is, the region of the electromagnet 13 close to the ring-shaped magnet 111a has the N pole. Since like poles repel each other, a magnetic force in a second direction D2 is generated by the electromagnet 13 and the first part P1 of the ring-shaped magnet 111a. In addition, the magnetic force is a repelling force. The roller 11a is continuously rotated.

At the second time point as shown in FIG. 8, the second part P2 of the ring-shaped magnet 111a is within the sensitive range of the sensing unit 12 and thus sensed by the sensing unit 12. At the second time point, the sensing result of the sensing unit 12 indicates that the pole of the second part P2 of the ring-shaped magnet 111a is the S pole. According to the sensing result, the control unit 14 issues a control signal to the electromagnet 13. According to the control signal, the electromagnet 13 and the second part P2 of the ring-shaped magnet 111a have opposite poles. That is, the region of the electromagnet 13 close to the ring-shaped magnet 111a has the N pole. Since opposite poles attract each other, a magnetic force in a third direction D3 is generated by the electromagnet 13 and the second part P2 of the ring-shaped magnet 111a. In addition, the magnetic force is an attractive force.

In the third usage state, the efficacy of increasing the operating speed of the roller 11a and the efficacy of decreasing the operating speed of the roller 11a are alternately achieved. Consequently, the rotating speed of the roller 11a is adjusted to a desired speed between the high rotating speed and the low rotating speed.

This embodiment may be varied according to the practical requirement. In case that the pole of the first part P1 of the ring-shaped magnet 111a is the N pole, the electromagnet 13 and the first part P1 of the ring-shaped magnet 111a have opposite poles according to the control signal from the control unit 14. That is, the region of the electromagnet 13 close to the ring-shaped magnet 111a has the S pole. In case that the pole of the second part P2 of the ring-shaped magnet 111a is the S pole, the electromagnet 13 and the first part P1 of the ring-shaped magnet 111a have like poles according to the control signal from the control unit 14. That is, the region of the electromagnet 13 close to the ring-shaped magnet 111a has the S pole.

Figure 9:
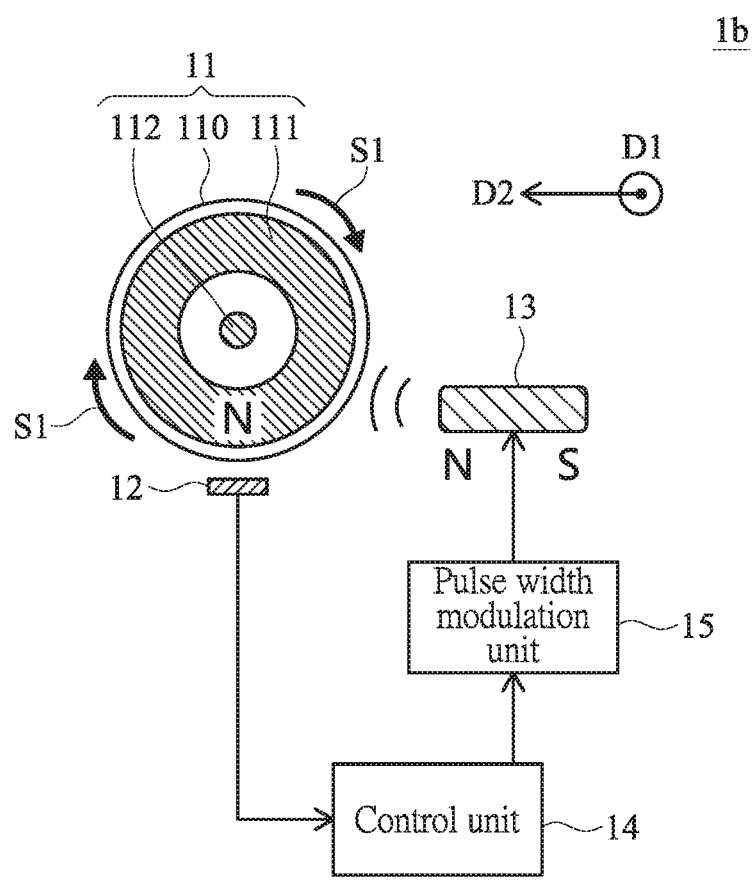
FIG. 9 schematically illustrates a mouse roller module according to a third embodiment of the present invention.

FIG. 9 schematically illustrates a mouse roller module according to a third embodiment of the present invention. The components of the mouse roller module 1b of this embodiment are similar to those of the mouse roller module 1 as shown in FIGS. 1 and 2 except that the mouse roller module 1b of this embodiment further comprises a pulse width modulation unit 15. The pulse width modulation unit 15 is electrically connected with the control unit 14 and the electromagnet 13. After sensing the pole of the ring-shaped magnet 111, the sensing unit 12 generates a sensing result. According to the sensing result, the control unit 14 issues a control signal to the pulse width modulation unit 15. According to the control signal from the control unit 14, the pulse width modulation unit 15 issues a pulse width modulation signal to the electromagnet 13. Consequently, the strength of the magnetic force provided by the electromagnet 13 is correspondingly adjusted. That is, when the user issues the command for increasing or decreasing the strength of the magnetic force of the electromagnet 13, the pulse width modulation unit 15 generates the pulse width modulation signal corresponding to the strength of the magnetic force. Consequently, when the mouse roller module is in each of the usage states as shown in FIGS. 1 to 8, the rotating speed of the roller 11 can be further adjusted.

From the above descriptions, the present invention provides the mouse roller module. The mouse roller module is equipped with the sensing unit for sensing the pole of the ring-shaped magnet within the casing of the roller. The control unit controls the electromagnet and the ring-shaped magnet to generate a magnetic force according to the result of sensing the pole of the ring-shaped magnet. The pole of the ring-shaped magnet and the pole of the electromagnet close to the ring-shaped magnet are like poles or opposite poles. Due to this design, the user can adjust the rotating effect of the roller according to the practical requirements. That is, the rotating speed of the roller can be selectively increased or decreased. Consequently, the flexibility and tactile feel of operating the mouse roller module are enhanced.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A mouse roller module, comprising:
   a roller comprising a ring-shaped magnet and a rotating shaft, wherein the rotating shaft is extended along a first direction, wherein when an external force is exerted on the roller, the ring-shaped magnet is rotated about the rotating shaft, and a position of the roller close to the sensing unit has a tangential speed direction;
   a sensing unit located near the roller to sense a pole of the ring-shaped magnet;
   an electromagnet, wherein the roller is arranged between the electromagnet and the sensing unit, and the electromagnet and the ring-shaped magnet interact with each other to generate a magnetic force; and
   a control unit electrically connected with the sensing unit and the electromagnet, wherein the control unit controls the electromagnet and the ring-shaped magnet of the roller to generate the magnetic force according to a result of sensing the pole of the ring-shaped magnet by the sensing unit;
   wherein according to the result of sensing the pole of the ring-shaped magnet by the sensing unit, when a region of the electromagnet close to the ring-shaped magnet and the ring-shaped magnet have like poles under control of the control unit, a magnetic force in a second direction is generated, wherein the second direction is not in parallel with the first direction, and the second direction is identical to the tangential speed direction of the roller.

2. The mouse roller module according to claim 1, wherein according to the result of sensing the pole of the ring-shaped magnet by the sensing unit, a region of the electromagnet close to the ring-shaped magnet and the ring-shaped magnet have like poles under control of the control unit, and the magnetic force in a second direction is generated, wherein the second direction is not in parallel with the first direction, and the second direction is identical to the tangential speed direction of the roller.

3. The mouse roller module according to claim 1, wherein the ring-shaped magnet comprises a first part and a second part, which have opposite poles, wherein according to the result of sensing the pole of the first part of the ring-shaped magnet at a first time point by the sensing unit, a region of the electromagnet close to the first part of the ring-shaped magnet and the first part of the ring-shaped magnet have like poles under control of the control unit, and the magnetic force in a second direction is generated, wherein according to the result of sensing the pole of the second part of the ring-shaped magnet at a second time point by the sensing unit, the region of the electromagnet close to the second part of the ring-shaped magnet and the second part of the ring-shaped magnet have like poles under control of the control unit, and the magnetic force in the second direction is generated, wherein the second direction is not in parallel with the first direction, and the second direction is identical to the tangential speed direction of the roller.

4. The mouse roller module according to claim 1, wherein the mouse roller module further comprises a pulse width modulation unit, which is electrically connected with the control unit and the electromagnet, wherein the control unit issues a control signal to the pulse width modulation unit according to the result of sensing the pole of the ring-shaped magnet by the sensing unit, wherein the pulse width modulation unit issues a pulse width modulation signal to the electromagnet according to the control signal, and a strength of the magnetic force provided by the electromagnet is adjusted according to the pulse width modulation signal.

5. The mouse roller module according to claim 1, wherein the ring-shaped magnet of the roller is a permanent magnet.

6. The mouse roller module according to claim 1, wherein the sensing unit is a Hall sensor.

7. A mouse roller module, comprising:
- a roller comprising a ring-shaped magnet and a rotating shaft, wherein the rotating shaft is extended along a first direction, wherein when an external force is exerted on the roller, the ring-shaped magnet is rotated about the rotating shaft, and a position of the roller close to the sensing unit has a tangential speed direction;
- a sensing unit located near the roller to sense a pole of the ring-shaped magnet;
- an electromagnet, wherein the roller is arranged between the electromagnet and the sensing unit, and the electromagnet and the ring-shaped magnet interact with each other to generate a magnetic force; and
- a control unit electrically connected with the sensing unit and the electromagnet, wherein the control unit controls the electromagnet and the ring-shaped magnet of the roller to generate the magnetic force according to a result of sensing the pole of the ring-shaped magnet by the sensing unit;
- wherein according to the result of sensing the pole of the first part of the ring-shaped magnet at a first time point by the sensing unit, when a region of the electromagnet close to the first part of the ring-shaped magnet and the first part of the ring-shaped magnet have first opposite poles under control of the control unit, the magnetic force in a third direction is generated, wherein according to the result of sensing the pole of the second part of the ring-shaped magnet at a second time point by the sensing unit, the region of the electromagnet close to the second part of the ring-shaped magnet and the second part of the ring-shaped magnet have second opposite poles under control of the control unit, the magnetic force in the third direction is generated, wherein the third direction is not in parallel with the first direction, and the third direction is opposite to the tangential speed direction of the roller.

8. A mouse roller module, comprising:
- a roller comprising a ring-shaped magnet and a rotating shaft, wherein the rotating shaft is extended along a first direction, wherein when an external force is exerted on the roller, the ring-shaped magnet is rotated about the rotating shaft, and a position of the roller close to the sensing unit has a tangential speed direction;
- a sensing unit located near the roller to sense a pole of the ring-shaped magnet;
- an electromagnet, wherein the roller is arranged between the electromagnet and the sensing unit, and the electromagnet and the ring-shaped magnet interact with each other to generate a magnetic force; and
- a control unit electrically connected with the sensing unit and the electromagnet, wherein the control unit controls the electromagnet and the ring-shaped magnet of the roller to generate the magnetic force according to a result of sensing the pole of the ring-shaped magnet by the sensing unit;
- wherein the ring-shaped magnet comprises a first part and a second part, which have opposite poles, wherein according to the result of sensing the pole of the first part of the ring-shaped magnet at a first time point by the sensing unit, a region of the electromagnet close to the first part of the ring-shaped magnet and the first part of the ring-shaped magnet have like poles under control of the control unit, and the magnetic force in a second direction is generated, wherein the second direction is not in parallel with the first direction, and the second direction is identical to the tangential speed direction of the roller, wherein according to the result of sensing the pole of the second part of the ring-shaped magnet at a second time point by the sensing unit, the region of the electromagnet close to the second part of the ring-shaped magnet and the second part of the ring-shaped magnet have opposite poles under control of the control unit, and the magnetic force in the third direction is generated, wherein the third direction is not in parallel with the first direction, the third direction is opposite to the tangential speed direction of the roller, and the third direction is opposite to the second direction.

* * * * *